United States Patent
Yao et al.

(10) Patent No.: US 10,425,002 B2
(45) Date of Patent: Sep. 24, 2019

(54) ERROR AMPLIFICATION APPARATUS AND DRIVING CIRCUIT INCLUDING THE SAME

(71) Applicant: Hangzhou Silan Microelectronics Co., Ltd., Hangzhou (CN)

(72) Inventors: Yunlong Yao, Hangzhou (CN); Jianxing Wu, Hangzhou (CN)

(73) Assignee: HANGZHOU SILAN MICROELECTRONICS CO., LTD., Hangzhou (CN)

( * ) Notice: Subject to any disclaimer, the term of this patent is extended or adjusted under 35 U.S.C. 154(b) by 0 days.

(21) Appl. No.: 16/060,791

(22) PCT Filed: Dec. 9, 2016

(86) PCT No.: PCT/CN2016/109328
§ 371 (c)(1),
(2) Date: Jun. 8, 2018

(87) PCT Pub. No.: WO2017/097260
PCT Pub. Date: Jun. 15, 2017

(65) Prior Publication Data
US 2019/0260280 A1    Aug. 22, 2019

(30) Foreign Application Priority Data
Dec. 10, 2015    (CN) .......................... 2015 1 0917062

(51) Int. Cl.
*H02M 1/15*    (2006.01)
*H02M 1/08*    (2006.01)
(Continued)

(52) U.S. Cl.
CPC ............... *H02M 1/08* (2013.01); *H02M 1/14* (2013.01); *H02M 3/157* (2013.01); *H05B 33/0815* (2013.01)

(58) Field of Classification Search
CPC ............ H02M 1/08; H02M 1/14; H02M 1/15; H02M 3/157; H02M 31/155; H02M 3/156; H02M 33/0815; H02M 33/0818
See application file for complete search history.

(56) References Cited

U.S. PATENT DOCUMENTS 4,315,200 A * 2/1982 Yamada ............... G05B 19/232
318/571
RE46,419 E * 5/2017 Isham ....................... G05F 1/40
(Continued)

FOREIGN PATENT DOCUMENTS

CN    102545662 A    7/2012
CN    104503526 A    4/2015

OTHER PUBLICATIONS

First Office Action, including Search Report, for Chinese Patent Application No. 201510917062.3, dated Jun. 28, 2017, 10 pages.
(Continued)

*Primary Examiner* — Adolf D Berhane
(74) *Attorney, Agent, or Firm* — Westman, Champlin & Koehler, P.A.

(57) ABSTRACT

The disclosure relates to an error amplification apparatus and a driving circuit including the error amplification apparatus. In the error amplification apparatus according to the disclosure, a pulse generating circuit generates a first pulse and a second pulse in accordance with an output voltage of an error amplification unit, a counting unit being coupled to the pulse generating circuit counts the first pulse and the second pulse, and generates a loop control signal representing a compensation voltage based on the count. The disclosure utilizes the counting unit to digitize the compensation voltage, and the counter value can reflect the compensation voltage, so that the variation of the loop control signal in the AC cycle of 50 Hz or 60 Hz is controlled to be little, thereby filtering out the ripple of AC of 50 Hz or 60 Hz. In this manner, the capacitance of the compensation capacitor is reduced so that the compensation capacitor can be integrated inside the IC chip, thereby simplifying the peripheral design, and eliminating the influence on the loop by the electrical leakage current due to moisture.

31 Claims, 10 Drawing Sheets

(51) Int. Cl.
H02M 1/14 (2006.01)
H02M 3/157 (2006.01)
H05B 33/08 (2006.01)

(56) References Cited

U.S. PATENT DOCUMENTS

| | | | | |
|---|---|---|---|---|
| 9,870,014 | B1* | 1/2018 | Ham | G05F 1/625 |
| 2008/0180039 | A1* | 7/2008 | Masuko | H05B 33/0815 |
| | | | | 315/291 |
| 2010/0141225 | A1* | 6/2010 | Isham | H02M 3/156 |
| | | | | 323/282 |
| 2010/0208502 | A1* | 8/2010 | Horii | H02M 3/33507 |
| | | | | 363/131 |
| 2011/0266975 | A1* | 11/2011 | Yu | H05B 33/0815 |
| | | | | 315/307 |
| 2012/0163042 | A1* | 6/2012 | Zhou | H02M 1/44 |
| | | | | 363/21.17 |
| 2012/0169313 | A1 | 7/2012 | Lee et al. | |
| 2016/0329734 | A1* | 11/2016 | Lee | H02M 3/156 |
| 2018/0224875 | A1* | 8/2018 | Ham | G05F 1/59 |

OTHER PUBLICATIONS

Second Office Action, including Search Report, for Chinese Patent Application No. 201510917062.3, dated Oct. 18, 2017, 6 pages.

* cited by examiner

ERROR AMPLIFICATION APPARATUS AND DRIVING CIRCUIT INCLUDING THE SAME

CLAIM OF PRIORITY

This application is a Section 371 National Stage Application of International Application No. PCT/CN2016109328, filed on Dec. 9, 2016, entitled "ERROR AMPLIFICATION APPARATUS AND DRIVING CIRCUIT INCLUDING THE SAME", which claims priority to Chinese Application No. 201510917062.3, filed on Dec. 10, 2015, entitled as "error amplification apparatus and driving circuit including the same", which are hereby incorporated by reference.

BACKGROUND OF THE DISCLOSURE

Field of the Disclosure

The disclosure relates to an error amplification apparatus and a driving circuit including the same.

Description of the Related Art

A conventional LED constant-current driving circuit with buck topology is shown in FIG. 1, the LED constant-current driving circuit is AC (Alternating Current) powered and has a Power Factor Correction (PFC) function. It typically includes an AC input rectifier circuit 101, an AC input source 102, an input capacitor Cin, an inductor L1, an power switch M1, a sampling resistor Rs, a freewheeling diode D1, an output capacitor Cbulk, an output current sampling circuit 111, an error amplifier 112, a compensation capacitor Ccomp, and a PWM signal generating circuit 113.

The AC input rectifier circuit 101 receives and rectifies an AC input voltage from the AC input source 102. The input capacitor Cin has one terminal being coupled to a voltage input terminal Vin and the other terminal being grounded. The power switch M1 has a source terminal being coupled to the voltage input terminal Vin, a drain terminal being coupled to one terminal of the sampling resistor Rs and an gate terminal at which a driving signal from the PWM signal generating circuit 113 is received. The inductor L1 has one terminal being coupled to the other terminal of the sampling resistor Rs and the other terminal being coupled to one terminal of the output capacitor Cbulk. The freewheeling diode D1 has a cathode being coupled to one terminal of the sampling resistor Rs and an anode being coupled to the other terminal of the output capacitor Cbulk. The output capacitor Cbulk is coupled in parallel with loads, such as an LED load. The sampling resistor Rs samples an output current for driving the power switch M1.

The output current sampling circuit 111 samples a voltage Vcs across the sampling resistor Rs to obtain an output current sampling voltage. The error amplifier 112 amplifies the error between the output current sampling voltage and a reference voltage Vref and provides a compensation voltage Vcomp. An output terminal of the error amplifier 112 is coupled to the compensation capacitor Ccomp. After the circuit loop is stable, the compensation voltage Vcomp is basically constant and the output current is determined by the reference voltage Vref. The PWM signal generating circuit 113 is respectively coupled to the output terminal of the error amplifier 112 and the gate terminal of the power switch M1, and thus the power switch M1 is controlled to be turned on and off.

After the power switch M1 is turned on, an input current flows through the sampling resistor Rs, the inductor L1, the output capacitor Cbulk and an output terminal Vout. The inductor L1 stores energy while the current flowing through it increases. After the power switch M1 is turned off, the current flowing through the inductor L1 continues to flow through the freewheeling diode D1 and the current flowing through the inductor L1 gradually decreases, the inductor L1 releases energy to the output capacitor Cbulk and the output terminal Vout. The power switch M1 is turned on by the error amplifier 112 and the PWM signal generating circuit 113 when the voltage Vcs across the sampling resistor Rs is smaller than the reference voltage Vref. The power switch M1 repeats the switching operations as above, and the circuit continuously operates in a critical conduction mode of an inductor current.

However, as the signal inputted from the AC input source 102 is typically an AC signal having a frequency of 50 Hz/60 Hz, the output current sampling voltage calculated by the output current sampling circuit 111 is a signal having a voltage-ripple of 50 Hz/60 Hz. Thus, in order to filter out the interference signals of 50 Hz/60 Hz, the capacitance of the compensation capacitor Ccomp cannot be too small, which is usually larger than 1 µF in a practical circuit. A compensation capacitor having such capacitance cannot be integrated into an integrated circuit. In case the compensation capacitor is implemented outside the chip, the compensation capacitor is susceptible to the electrical leakage due to moisture, influencing the output current and making it difficult to implement a simple peripheral circuit.

BRIEF DESCRIPTION OF THE DISCLOSURE

The objective of the disclosure is to provide an error amplification apparatus and a driving circuit including the same for solving the current problems.

According to a first aspect of the disclosure, there is provided an error amplification apparatus, comprising:

an error amplification unit;

a pulse generating circuit being coupled to said error amplification unit and configured to generate a first pulse and a second pulse in accordance with an output voltage of said error amplification unit;

a counting unit being coupled to said pulse generating circuit and configured to count said first pulse and said second pulse and generate a loop control signal representing a compensation voltage based on said count;

Preferably, said counting unit comprises: a counter being coupled to said pulse generating circuit and configured to count said first pulse and said second pulse; and a counter signal sample and hold circuit being coupled to said counter and receiving a sampling signal with a constant time interval which is synchronized with a rectified alternating current input and which controls said counter signal sample and hold circuit to sample a counter value from said counter at a constant time interval.

Preferably, wherein said counting unit comprises: an up-down counter having a predetermined number of counting bits and being coupled to said pulse generating circuit, said up-down counter is configured to count up or down said first pulse and said second pulse to output said loop control signal reflecting the compensation voltage, said loop control signal is directly used to control a PWM signal or converted to an analog signal to control a PWM signal in order to filter out a ripple of alternating current.

Preferably, said up-down counter is configured to provide a counter value which increases during a first part of a half cycle of alternating current and decreases during a second part of said half cycle of alternating current, the increased counter value being equal to the decreased counter value in said half cycle of alternating current.

Preferably, said pulse generating circuit comprises a first pulse generating circuit for generating said first pulse and a second pulse generating circuit for generating said second pulse.

Preferably, said error amplification unit comprises a first timing-current generating circuit, a first capacitor, a first switch, a first comparator, a second timing-current generating circuit, a second capacitor, a second switch and a second comparator; said first comparator has a positive input terminal being coupled to said first timing-current generating circuit, one terminal of said first capacitor and a source terminal of said first switch, a negative input terminal for receiving a first reference voltage and an output terminal being coupled to an input terminal of said first pulse generating circuit; said first pulse generating circuit has an output terminal being coupled to an input terminal of said counting unit, said first switch has a gate terminal being coupled to said input terminal of said counting unit and a drain terminal being grounded, and the other terminal of said first capacitor is grounded; said second comparator has a positive input terminal being coupled to said second timing-current generating circuit, one terminal of said second capacitor and a source terminal of said second switch, said second comparator has a negative input terminal for receiving a second reference voltage and an output terminal being coupled to an input terminal of said second pulse generating circuit; and said second pulse generating circuit has an output terminal being coupled to another input terminal of said counting unit, said second switch has a gate terminal being coupled to another input terminal of said counting unit and a drain terminal being grounded, said second capacitor has the other terminal being grounded.

Preferably, said first timing-current generating circuit charges said first capacitor under control of a reference voltage, said first comparator reverses and said first pulse generating circuit generates said first pulse to control said first switch to be turned on for clearing a voltage across said first capacitor when a charging voltage reaches a first reference voltage, and a next charging and pulse generation process continue; said second timing-current generating circuit charges said second capacitor under control of an output current sampling signal, said second comparator reverses and said second pulse generating circuit generates a second pulse for controlling said second switch to be turned on for clearing a voltage across said second capacitor when a charging voltage reaches a second reference voltage, and a next charging and pulse generation process continue.

Preferably, a following relationship is satisfied in a half cycle of alternating current, $I1 \times C22 \times VB = I2avg \times C21 \times VA$, wherein $I1$ is a current value generated by said first timing-current generating circuit, $C22$ is a capacitance value of said second capacitor, $VB$ is a voltage value of said second reference voltage, $I2avg$ is an average of a current value generated by said second timing-current generating circuit, $C21$ is a capacitance value of said first capacitor and $VA$ is a voltage value of said first reference voltage.

Preferably, an average of a current value generated by said second timing-current generating circuit is determined by a current value generated by said first timing-current generating circuit, a capacitance value of said second capacitor, a voltage value of said second reference voltage, a capacitance value of said first capacitor and a voltage value of said first reference voltage.

Preferably, said error amplification unit comprises an error amplifier, a capacitor, a first switch, a first comparator, a second switch and a second comparator; said error amplifier has a positive input terminal for receiving a reference voltage, a negative input terminal for receiving an output current sampling signal, and an output terminal being coupled to a positive input terminal of said first comparator and a positive input terminal of said second comparator; said first comparator has a negative input terminal for receiving a third reference voltage and an output terminal being coupled to an input terminal of said first pulse generating circuit; said first pulse generating circuit has an output terminal being coupled to one input terminal of said counting unit and provides said first pulse to control said first switch to be turned on and off; said second comparator has a negative input terminal for receiving a fourth reference voltage and an output terminal being coupled to an input terminal of said second pulse generating circuit; said second pulse generating circuit has an output terminal being coupled to another input terminal of said counting unit and provides said second pulse to control said second switch to be turned on and off; and said capacitor has one terminal being coupled an output terminal of said error amplifier and the other terminal being grounded.

Preferably, said capacitor is charged when an input voltage of said positive input terminal of said error amplifier is larger than an input voltage of said negative input terminal of said error amplifier, a first pulse is generated to turn on said first switch and a potential of said capacitor is pulled to ½*(said third reference voltage+said fourth reference voltage) when a charging voltage is larger than said third reference voltage; said capacitor is discharged when an input voltage of said positive input terminal of said error amplifier is smaller than an input voltage of said negative input terminal of said error amplifier, a second pulse is generated to turn on said second switch and a potential of said capacitor is pulled to ½*(said third reference voltage+said fourth reference voltage) when a discharging voltage is smaller than said fourth reference voltage.

Preferably, a voltage difference for charging said capacitor, which corresponds to said first pulse, is ½*(said third reference voltage−said fourth reference voltage), a voltage difference for discharging said capacitor, which corresponds to said second pulse, is ½*(said third reference voltage−said fourth reference voltage), and in a half cycle of alternating current, a counter value of said first pulse being identical to a counter value of said second pulse indicates that a charging amount of said capacitor is equal to a discharging amount of said capacitor.

Preferably said error amplifier is a transconductance error amplifier.

Preferably said pulse generating circuit comprises a third pulse generating circuit for generating a pulse signal to obtain said first pulse and said second pulse.

Preferably said error amplification unit comprises an error amplifier, a capacitor, a first switch, a first comparator, a second comparator, four selective switches and an inverter; said error amplifier has a positive input terminal for receiving a reference voltage and a negative input terminal for receiving an output current sampling signal; said first comparator has a positive input terminal for receiving a fifth reference voltage, a negative input terminal being coupled to an output terminal of said error amplifier and an output terminal being coupled to an input terminal of said third pulse generating circuit and said inverter, said fifth reference voltage is ½*(said third reference voltage+said fourth reference voltage); said second comparator has a positive input terminal being coupled to said capacitor and said third reference voltage or said fourth reference voltage by said four selective switches, said second comparator has an output terminal being coupled to an input terminal of said third pulse generating circuit; said third pulse generating circuit has an output terminal being coupled to an input terminal of said counting unit and provides a pulse signal for controlling said first switch to be turned on and off.

Preferably said capacitor is charged when an input voltage of said positive input terminal of said error amplifier is larger than an input voltage of said negative input terminal of said error amplifier, and when a charging voltage is larger than ½*(the said third reference voltage+the said fourth reference voltage), said first comparator provides a first switching selection signal and a positive input terminal of said first comparator is coupled to said capacitor and a negative input terminal of said first comparator receives said third reference voltage and said first switching selection signal controls said third pulse generating circuit such that when a charging voltage is larger than said third reference voltage, a first pulse is generated for turning on said first switch and a potential of said capacitor is pulled to ½*(said third reference voltage+said fourth reference voltage); said capacitor is discharged when an input voltage of said positive input terminal of said error amplifier is smaller than an input voltage of said negative input terminal of said error amplifier; and when a discharging voltage is smaller than ½*(said third reference voltage+said fourth reference voltage), said first comparator provides a second switching selection signal and a positive input terminal of said second comparator is coupled to said fourth reference voltage and a negative input terminal of said second comparator is coupled to said capacitor; a second pulse is generated to turn on said first switch and a potential of said capacitor is pulled to ½*(said third reference voltage+said fourth reference voltage) when a discharging voltage is smaller than said fourth reference voltage.

Preferably, a voltage difference for charging said capacitor, which corresponds to said first pulse, is ½*(said third reference voltage−said fourth reference voltage), a voltage difference for discharging said capacitor, which corresponds to said second pulse, is ½*(said third reference voltage−said fourth reference voltage), and in a half cycle of alternating current, a counter value of said first pulse being identical to a counter value of said second pulses indicates that a charging amount of said capacitor is equal to a discharging amount of said capacitor.

Preferably, said counter is an up-down counter.

Preferably, said counter is configured to count up for said first pulse and count down for said second pulse, or said counter is configured to count up for said second pulse and count down for said first pulse.

Preferably, in a half cycle of alternating current, said counter value of said counter and said digital signal stored in said counter signal sample and hold circuit will increase if an incremental value of said counter is larger than a decremental value of said counter, and in a half cycle of alternating current, said counter value of said counter and a digital signal stored in said counter signal sample and hold circuit will decrease if an incremental value of said counter is smaller than a decremental value of said counter, and in a half cycle of alternating current, said counter value of said counter and a digital signal stored in said counter signal sample and hold circuit will be unchanged if an incremental value of said counter is equal to a decremental value of said counter.

Preferably, said counter is on the basis of a trigger.

Preferably, said counter signal sample and hold circuit is on the basis of a trigger.

Preferably, said sampling signal with a constant time interval is obtained from a voltage and current waveform relevant to the alternating current input.

Preferably, said counter signals sample and hold circuit provides a digital signal which is directly used to control a PWM signal or which is converted to an analog signal to control a PWM signal.

Preferably, said up-down counter is on the basis of a trigger.

Preferably, said up-down counter is a decimal up-down counter.

Preferably, said up-down counter is a 10-bit or 15-bit up-down counter.

Preferably, wherein said error amplification apparatus is used in a closed-loop constant-current control circuit, a closed-loop constant-voltage control circuit or a closed-loop constant-power control circuit.

Preferably, said error amplification apparatus is used in a buck topology, a boost topology, a fly-back topology or a buck-boost topology.

According to another aspect of the disclosure, there is provided a driving circuit comprising the error amplification apparatus as described above.

Preferably, said driving circuit further comprises an output current sampling circuit being coupled to an input terminal of said error amplifier and a PWM signal generating circuit being coupled to an output terminal of said error amplifier.

In the error amplification apparatus according to the disclosure, the pulse generating circuit generates the first pulse and second pulse in accordance with an output voltage of an error amplification unit, the counting unit being coupled to the pulse generating circuit counts the first pulse and the second pulse and generates a loop control signal representing a compensation voltage based on the count. The disclosure utilizes the counting unit to digitize the compensation voltage such that the compensation voltage may be reflected by the counter value. Accordingly, the variation of the loop control signal in the cycle of alternating current of 50 Hz or 60 Hz can be controlled to be little, thereby filtering out the ripple of alternating current of 50 Hz or 60 Hz. In this manner, the capacitance of the compensation capacitor is reduced such that the compensation capacitor can be integrated into the IC, thereby simplifying the peripheral design and eliminating the affection of the electrical leakage caused by moisture on the loop. Moreover, in some embodiments, an up-down counter may be used to count up and down. In this case, a loop control signal may be obtained if the number of counting bits of the up-down counter is set, without the need for a transfer signal aligned with the AC waveform, thereby simplifying the circuit and stabilizing the loop.

DETAILED DESCRIPTION OF EMBODIMENTS OF THE DISCLOSURE

Figure 1:
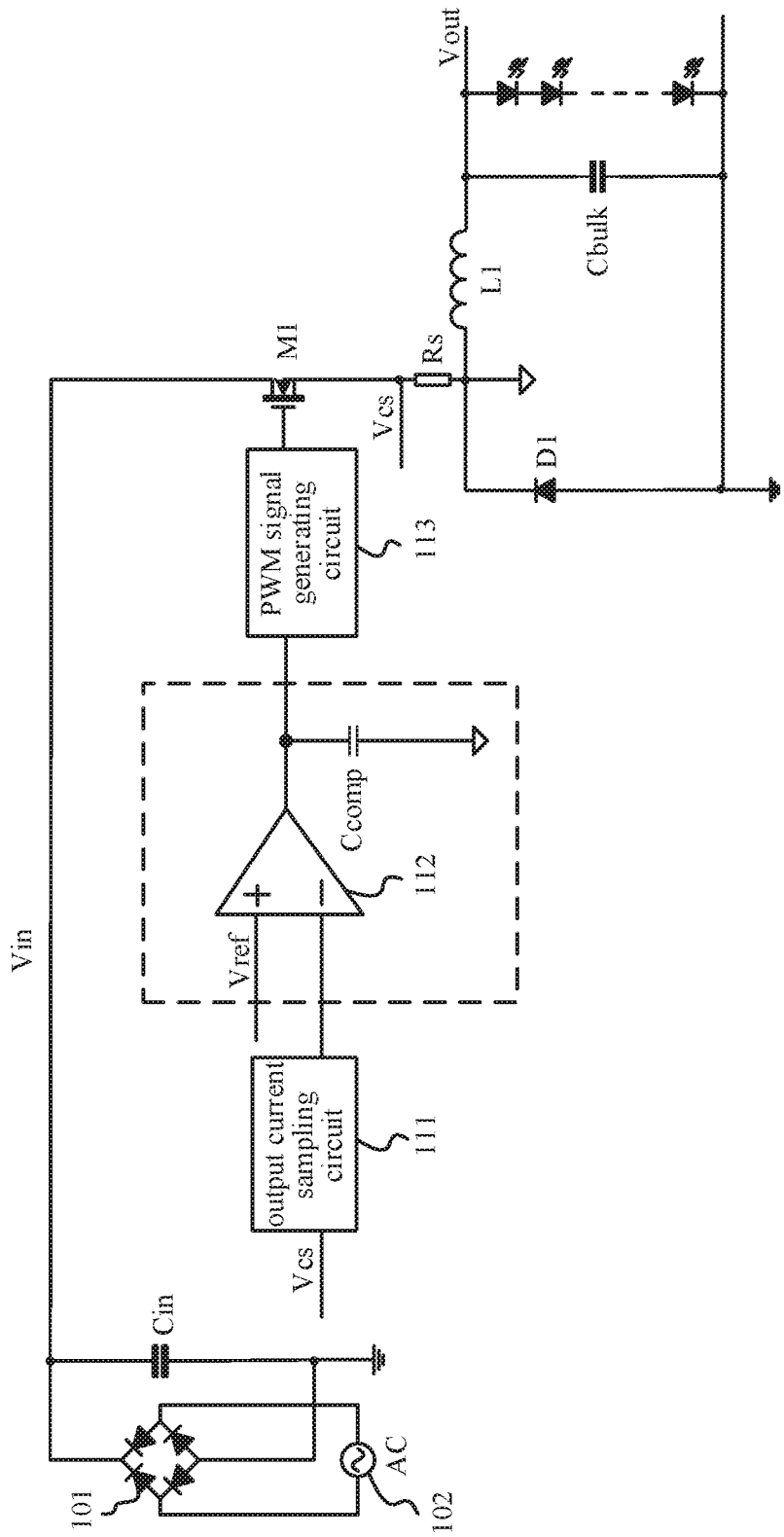
FIG. 1 is a schematic circuit diagram of a conventional LED constant-current driving circuit having a buck topology.

The present disclosure is intended to provide an error amplification apparatus including an error amplification unit, a pulse generating circuit and a counting unit. The pulse generating circuit is coupled to the error amplification unit and generates a first pulse and a second pulse in accordance with an output voltage of the error amplification unit. The counting unit is coupled to the pulse generating circuit and configured to count the first pulse and the second pulse and generate a loop control signal representing a compensation voltage based on said count. The present disclosure digitize the compensation voltage by using the counting unit, the counter value of which can reflect the compensation voltage, such that the variation of the loop control signal in the cycle of the alternating current of 50 Hz or 60 Hz can be controlled to be little, filtering out the ripple of the alternating current of 50 Hz or 60 Hz. It is possible to make the loop control voltage, which controls the generation of a PWM signal, to be substantially irrelevant to the ripple of the input AC voltage, in order to decrease the compensation capacitance.

In some embodiments, the counting unit comprises: a counter being coupled to the pulse generating circuit and configured to count the first pulse and the second pulse; and a counter signal sample and hold circuit being coupled to the counter and configured to receive a sampling signal with a constant time interval, which is synchronized with a rectified AC input and controls the counter signal sample and hold circuit to sample a counter value from the counter at a constant time interval. The compensation voltage is digitalized by using the counter and sampled at a constant time interval. The time interval is synchronized with the input AC voltage of 50 Hz or 60 Hz. Thus, no alternating current signal of 50 Hz or 60 Hz is included in the output signal of the counter signal sample and hold circuit, that is, the voltage ripple of the AC voltage of 50 Hz or 60 Hz is filtered out. A loop control voltage is generated by digital-analog conversion in order to control the generation of the PWM signal, so that the loop control voltage is controlled to be irrelevant to the voltage ripple of the input AC voltage, so as to reduce the capacitance of the compensation capacitor.

In some embodiments, the counting unit includes an up-down counter. The pulse generating circuit generates a first pulse, a second pulse signal and a counting direction signal. The up-down counter counts up and down in accordance with the counting direction signal, the counter value reflects the compensation voltage, the output signal of the counter is used as a loop control signal. By setting the number of bits for the up-down counter, the variation in the loop control signal corresponding to the up-down counter is small in the cycle of the alternating current of 50 Hz or 60 Hz, thereby filtering out the ripple of the alternating current of 50 Hz or 60 Hz. In this manner, the capacitance of the compensation capacitor is reduced, such that the compensation capacitor can be integrated into the IC, thereby simplifying the peripheral design and eliminating the affection of the electrical leakage caused by moisture on the loop. Moreover, due to the up-down counting of the up-down counter, the loop control signal may be obtained by setting the number of bits for the up-down counter without the need for a transfer signal aligned with the AC waveform, thereby simplifying the circuit and stabilizing the loop.

Reference will now be made in detail to the error amplification apparatus provided by the disclosure, examples of which are illustrated in the accompanying drawings. According to the following description, advantages and features of the disclosure will become more apparent. It should be noted that the drawings are illustrative and not to scale for the purpose of illustrating the objective of the disclosure conveniently and clearly.

A First Embodiment

Figure 2:
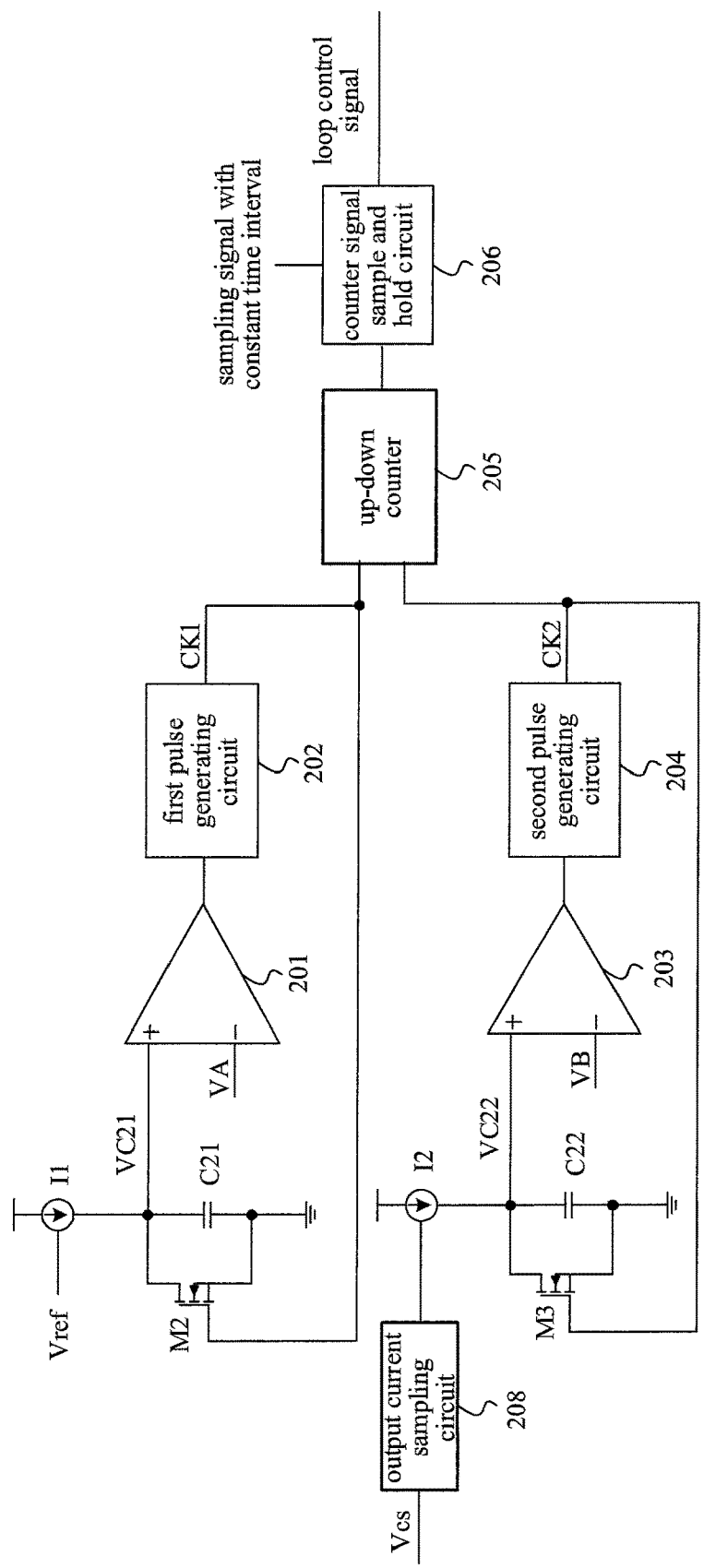
FIG. 2 is a schematic circuit diagram of an example error amplification apparatus according to a first embodiment of the present disclosure.

FIG. 2 is a schematic circuit diagram of an example error amplification apparatus according to a first embodiment of the present disclosure. The error amplification apparatus includes a first timing-current generating circuit I1, a first capacitor C21, a first switch M2, a first comparator 201, a first pulse generating circuit 202, a second timing-current generating circuit 12, a second capacitor C22, a second switch M3, a second comparator 203, a second pulse generating circuit 204, an up-down counter 205, a counter signal sample and hold circuit 206. The counter signal sample and hold circuit 206 provides a digital signal to control the circuit loop.

Specifically, as shown in FIG. 2, a reference voltage Vref controls the first timing-current generating circuit I1, the first timing-current generating circuit I1, one terminal of the first capacitor C21, and a source terminal of the first switch M2 are coupled to the positive input terminal of the first comparator 201. The first comparator 201 has a negative input terminal for receiving a first reference voltage VA, and an output terminal being coupled to an input terminal of the first pulse generating circuit 202. An output terminal of the first pulse generating circuit 202 and a gate terminal of the first switch M2 are coupled to an input terminal of the up-down counter 205. The first capacitor C21 has the other terminal being grounded. The first switch M2 has a drain terminal being grounded. The output current sampling circuit 208 samples a voltage Vcs cross a sampling resistor Rs to calculate an output current sampling signal for controlling the second timing-current generating circuit 12. The second timing-current generating circuit 12, one terminal of the second capacitor C22 and a source terminal of the second switch M3 are coupled to a positive input terminal of the second comparator 203. The second comparator 203 has a negative input terminal for receiving a second reference voltage VB, and an output terminal being coupled to an input terminal of the second pulse generating circuit 204. An output terminal of the second pulse generating circuit 204 and a gate terminal of the second switch M3 are coupled to an input terminal of the up-down counter 205. The other terminal of the second capacitor C22 and a drain terminal of the second switch M3 are grounded. An output terminal of the up-down counter 205 is coupled to an input terminal of the counter signal sample and hold circuit 206 and an output terminal of the counter signal sample and hold circuit 206 provides an control signal for controlling the circuit loop.

Figure 3:
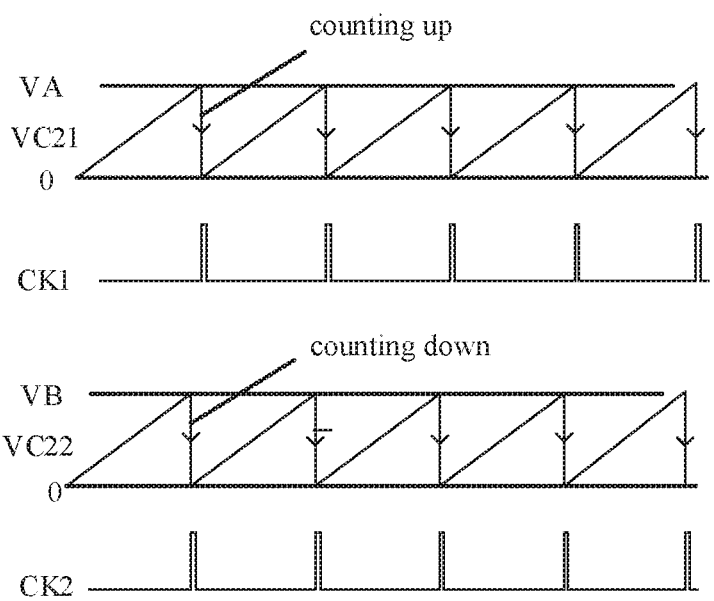
FIG. 3 is a schematic diagram showing the relationship between a narrow pulse and the voltage across the compensation capacitor as described in FIG. 2.

As referring to FIG. 2 in connection with FIG. 3, the reference voltage Vref controls the first timing-current generating circuit I1 to charge the first capacitor C21. When the charging voltage reaches the first reference VA, the first comparator 201 reverses and a first pulse CK1 is generated by the first pulse generating circuit 202 for turning on the first switch M2 and clearing the voltage across the first capacitor C21, and then a next process for charging capacitor and pulse generation continues. Thus, the number of the first pulse CK1 represents the times for which the first timing-current generating circuit I1 has charged the first capacitor C21 to the first reference voltage VA. Likewise, the output current sampling signal controls the second timing-current generating circuit 12 to charge the second capacitor C22. When the charging voltage reaches the second reference VB, the second comparator 203 reverses and a second pulse CK2 is generated by the second pulse generating circuit 204 for turning on the second switch M3 and clearing the voltage across the second capacitor C22, and then a next process for charging capacitor and pulse generation continues. Thus, the number of the second pulse CK2 represents the times for which the second timing-current generating circuit 12 has charged the second capacitor C22 to the second reference voltage VB.

The up-down counter 205 is capable of counting up and down. In a first condition, counting up is performed for the first pulse CK1 and counting down is performed for the second pulse CK2. In a second condition, counting up is performed for the second pulse CK2 and counting down is performed for the first pulse CK1. An output terminal of the up-down counter 205 is coupled to the counter signal sample and hold circuit 206 which samples and holds the counter values from the counter 205 at a constant time interval. As a non-limiting example, the up-down counter 205 and counter signal sample and hold circuit 206 are both on the basis of a trigger.

Figure 4:
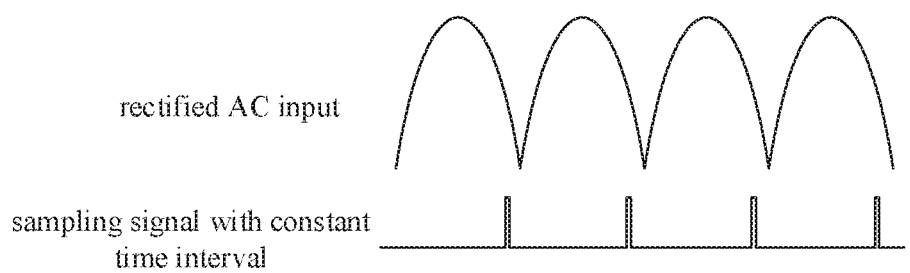
FIG. 4 is a schematic diagram showing a sampling signal with an constant time interval and a rectified AC input synchronized with the sampling signal.

As shown in FIG. 4, the sampling signal with a constant time interval is in synchronization with the rectified alternating current input. In a half cycle of alternating current, the counter value of the up-down counter 205 and the digital signal stored in the counter signal sample and hold circuit 206 are increased if the incremental value is larger than the decremental value. In a half cycle of alternating current, the counter value of the up-down counter 205 and the digital signal stored in the counter signal generating circuit 206 are decreased if the incremental value is smaller than the decremental value. In a half cycle of alternating current, the counter value of the up-down counter 205 and the digital signal stored in the counter signal sample and hold circuit 206 are unchanged if the incremental value is equal to the decremental value.

After the circuit loop is stable, the following relationship is satisfied in a half cycle of alternating current, that is, $$I1 \times C22 \times VB = I2avg \times C21 \times VA$$

wherein I1 is a current value generated by the first timing-current generating circuit, C22 is a capacitance value of the second capacitor, VB is a voltage value of the second reference voltage, I2avg is an average of a current value generated by the second timing-current generating circuit, C21 is a capacitance value of the first capacitor and VA is a voltage value of the first reference voltage. I2avg reflects an output current value. As seen from this equation, the average of the current value generated by the second timing-current generating circuit 12 is determined, that is, the output current value is determined, as long as the current value generated by the first timing-current generating circuit I1, the capacitance value of the second capacitor C22, the voltage value of the second reference voltage VB, the capacitance value of the first capacitor C21 and the voltage value of the first reference voltage VA are set. The counter signal sample and hold circuit 206 provides an output signal equivalent to the compensation voltage Vcomp of the circuit loop shown in FIG. 1.

As a non-limiting example, the sampling signal with a constant time interval may be obtained from the voltage or current waveforms relevant to the alternating current input waveform. The digital signal from the counter signal sample and hold circuit 206 may be used directly for controlling a PWM signal to adjust the duty cycle of the PWM signal, such that the output current can be stabilized by a negative feedback of the loop. The digital signal from the counter signal sample and hold circuit 206 may be converted into an analog signal, and then the analog signal are used for controlling the PWM signal to adjust the duty cycle of the PWM signal, such that the output current can be stabilized by a negative feedback of the loop.

A Second Embodiment

There are problems of circuit matching because the first capacitor C21 and second capacitor C22 are used in FIG. 2. Therefore, in the embodiment, the first capacitor C21 and second capacitor C22 is replaced by one capacitor C31, and the first timing-current generating circuit I1 and second timing-current generating circuit 12 is replaced by an error amplifier 401. The error amplifier 401 is typically a transconductance error amplifier.

Figure 5:
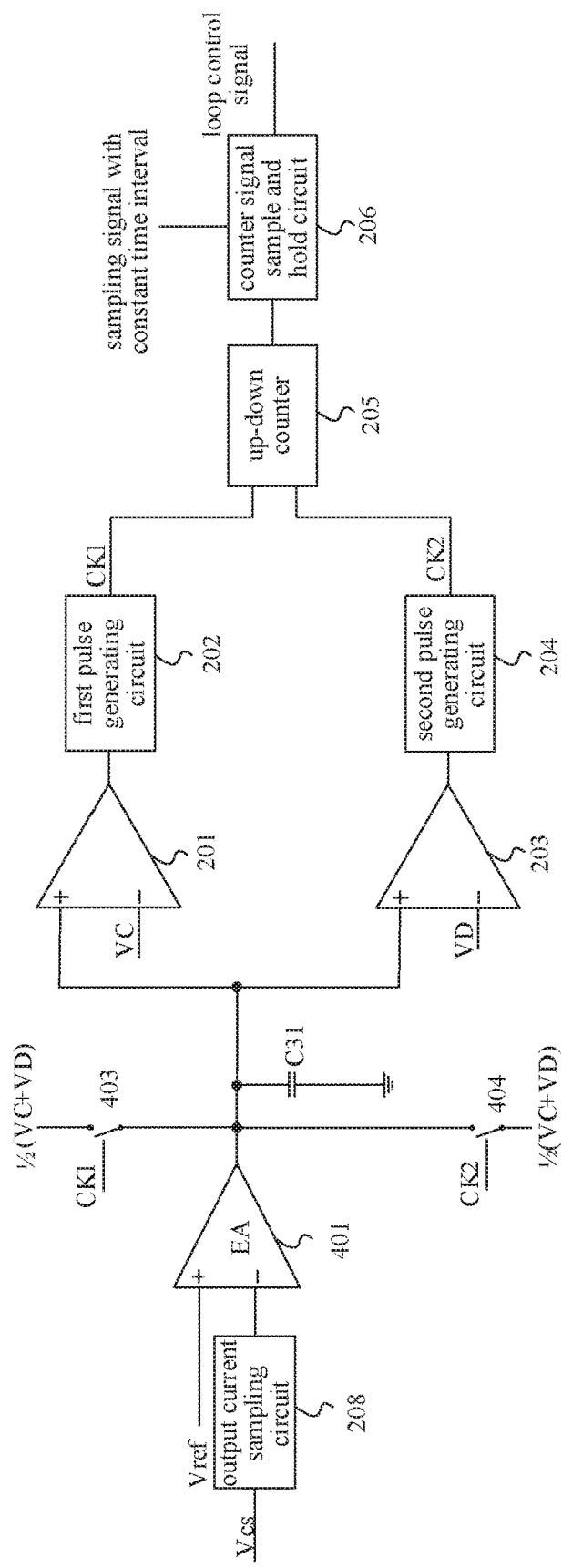
FIG. 5 is a schematic circuit diagram of an example error amplification apparatus according to a second embodiment of the present disclosure.

FIG. 5 is a schematic circuit diagram of an example error amplification apparatus according to the second embodiment of the present disclosure. As shown in FIG. 5, the error amplification unit includes an error amplifier 401, a capacitor C31, a first switch 403, a first comparator 201, a second switch 404 and a second comparator 203.

The error amplifier 401 has two input terminals being respectively configured to receive a reference voltage Vref and an output current sampling signal, and an output terminal being coupled to a positive input terminal of the first comparator 201 and a positive input terminal of the second comparator 203. A negative input terminal of the first comparator 201 is configured to receive a third reference voltage VC and an output terminal of the first comparator 201 is coupled to an input terminal of a first pulse generating circuit 202. An output terminal of the first pulse generating circuit 202 is coupled to one input terminal of an up-down counter 205. The first pulse generating circuit 202 provides a first pulse for turning on and off the first switch 403. A negative input terminal of the second comparator 203 is configured to receive a fourth reference voltage VD and an output terminal of the second comparator 203 is coupled to an input terminal of the second pulse generating circuit 204. An output terminal of the second pulse generating circuit 204 is coupled to the other input terminal of the up-down counter 205. The second pulse generating circuit 204 provides a second pulse for turning on and off the second switch 404. The capacitor C31 has one terminal being coupled to an output terminal of the error amplifier 401 and the other terminal being grounded.

The capacitor C31 is charged when an input voltage of the positive input terminal of the error amplifier 401 is larger than an input voltage of the negative input terminal of the error amplifier 401. A first pulse CK1 is generated to turn on the first switch 403 and the potential of the capacitor C31 is pulled to $\frac{1}{2}*(VC+VD)$ when a charging voltage is larger than the third voltage VC. The capacitor C31 is discharged when the input voltage of the positive input terminal of the error amplifier 401 is smaller than the input voltage of the negative input terminal of the error amplifier 401. A second pulse CK2 is generated to turn on the second switch 404 and the potential of the capacitor C31 is pulled to $\frac{1}{2}*(VC+VD)$ when the discharging voltage is smaller than the fourth reference voltage VD. The first switch 403 and second switch 404 can be implemented by one switch.

The voltage difference for charging the capacitor C31, which corresponds to the first pulse CK1, is equal to $\frac{1}{2}*(VC-VD)$, and the voltage difference for discharging the capacitor C31, which corresponds to the second pulse CK2, is equal to $\frac{1}{2}*(VC-VD)$. That is, the voltage difference for charging the capacitor C31 is equal to the voltage difference for discharging the capacitor C31. Accordingly, in a half cycle of alternating current, the counter value of the first pulse CK1 being identical to the counter value of the second pulse CK2 indicates that the charging amount of the capacitor C31 is equal to the discharging amount of the capacitor C31. Thus, the positive and negative input terminals of the error amplifier have the same input voltage, i.e. the function of the error amplifier is accomplished.

A Third Embodiment

Figure 6:
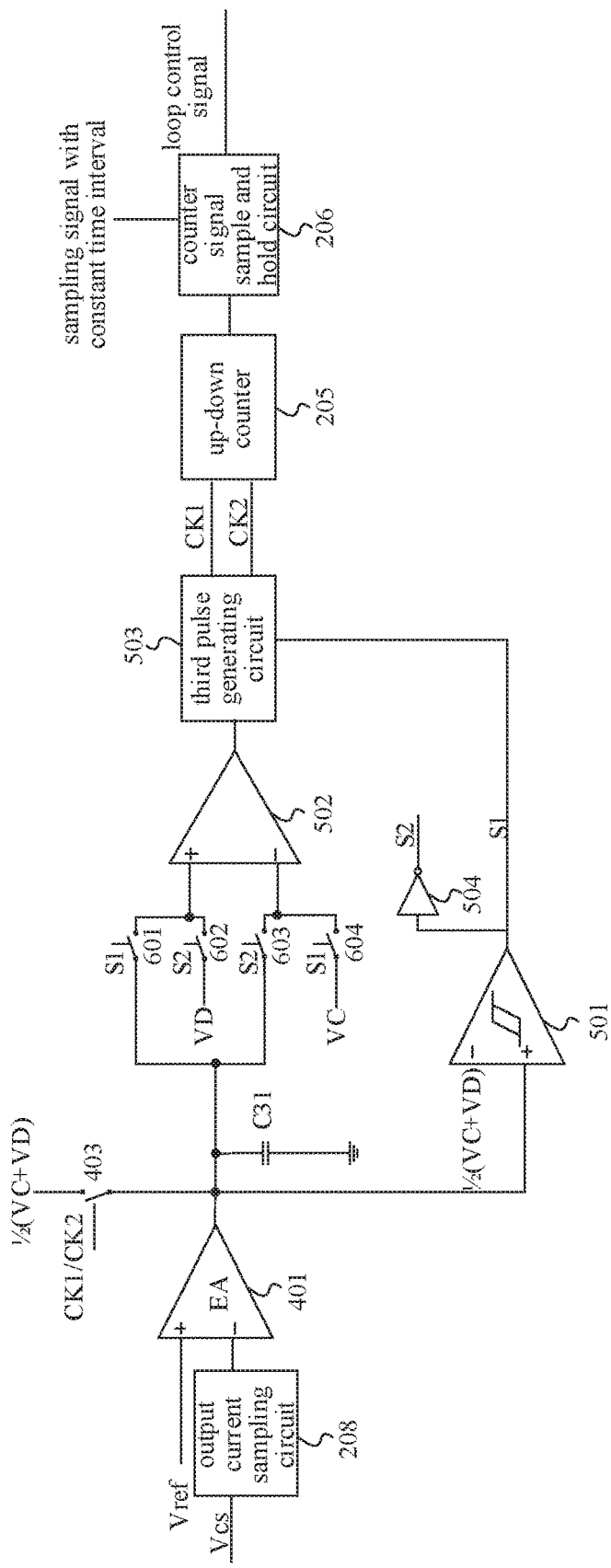
FIG. 6 is a schematic circuit diagram of an example error amplification apparatus according to a third embodiment of the present disclosure.

FIG. 6 is a schematic circuit diagram of an example error amplification apparatus according to the third embodiment of the present disclosure. As shown in FIG. 6, the first pulse generating circuit and the second pulse generating circuit of FIG. 5 are combined, i.e. a third pulse generating circuit 503 is employed. The second comparator 502 has an input terminal being coupled to the capacitor C31, VC and VD through selective switches. The first comparator 501 receives a first switching selection signal S1 and a second switching selection signal S2. The first switching selection signal S1 controls the third pulse generating circuit 503. The third pulse generating circuit 503 provides a pulse signal. The counter direction is controlled by the first switching selection signal S1, such that the first pulse CK1 and the second pulse CK2 are obtained from the pulse signal outputted from the third pulse generating circuit 503 to obtain the first pulse CK1 and the second pulse CK2.

Specifically, the error amplification unit includes an error amplifier 401, a capacitor C31, a switch 403, a first comparator 501, a second comparator 502, selective switches 601, 602, 603, 604 and an inverter 504. The error amplifier 401 has two input terminals being respectively configured to receive a reference voltage Vref and an output current sampling signal. The first comparator 501 has a positive input terminal for receiving a fifth reference voltage $\frac{1}{2}*$(VC+VD), a negative input terminal being coupled to an output terminal of the error amplifier 401, and output terminal being coupled to an input terminal of the third pulse generating circuit 503 and the inverter 504. The second comparator 502 has a positive input terminal being coupled to the capacitor C31 or VD through the selective switches 601 and 602, a negative input terminal being coupled to the capacitor C31 or VC through the selective switches 603 and 604, and an output terminal being coupled to an input terminal of the third pulse generating circuit 503. An output terminal of the third pulse generating circuit 503 is coupled to an input terminal of the up-down counter 205. The third pulse generating circuit 503 provides a pulse signal for turning on and off the switch 403.

The capacitor C31 is charged when an input voltage of the positive input terminal of the error amplifier 401 is larger than an input voltage of the negative input terminal of the error amplifier 401. When a charging voltage is larger than $\frac{1}{2}*(VC+VD)$, the first comparator 501 provides a first switching selection signal S1 for turning on the selective switches 601 and 604, so that the positive input terminal of the comparator 502 is coupled to the capacitor C31, and the negative input terminal of the comparator 502 receives the third reference voltage VC. Meanwhile, the first switching selection signal S1 controls the third pulse generating circuit 503, and a first pulse CK1 is generated for turning on the switch 403 and the potential of the capacitor C31 is pulled to $\frac{1}{2}*(VC+VD)$ when a charging voltage is larger than the third reference voltage VC.

The capacitor C31 is discharged when an input voltage of the positive input terminal of the error amplifier 401 is smaller than an input voltage of the negative input terminal of the error amplifier 401. When the discharging voltage is smaller than $\frac{1}{2}*(VC+VD)$, the first comparator 501 provides a second switching selection signal S2 for turning on the selective switches 602 and 603 so that the positive input terminal of the comparator 502 receives the fourth reference voltage VD and the negative input terminal of the comparator 502 is coupled to the capacitor C31. When the discharging voltage is smaller than VD, a second pulse CK2 is generated for turning on the switch 403 and the potential of the capacitor C31 is pulled to $\frac{1}{2}*(VC+VD)$.

The voltage difference for charging the capacitor C31, which corresponds to the first pulse CK1, is equal to $\frac{1}{2}*(VC-VD)$, and the voltage difference for discharging the capacitor C31, which corresponds to the second pulse CK2, is equal to $\frac{1}{2}*(VC-VD)$. That is, the voltage difference for charging the capacitor C31 is equal to the voltage difference for discharging the capacitor C31. Accordingly, in a half cycle of alternating current, the counter value of the first pulse CK1 being identical to the counter value of the second pulse CK2 indicates that the charging amount of the capacitor C31 is equal to the discharging amount of the capacitor C31. Thus, the positive and negative input terminals of the error amplifier have same input voltage, i.e. the function of error amplifier is accomplished. The first pulse CK1 and second pulse CK2 have same function as in FIG. 2 and FIG. 4, and related description is omitted herein for simplicity.

In the view of the generation process of the first pulse CK1 and the second pulse CK2, the first pulse CK1 and the second pulse CK2 can be combined into one signal (the first pulse CK1 and the second pulse CK2 are obtained from the one and same pulse signal outputted from the third pulse generating circuit 503).

A Fourth Embodiment

Figure 7:
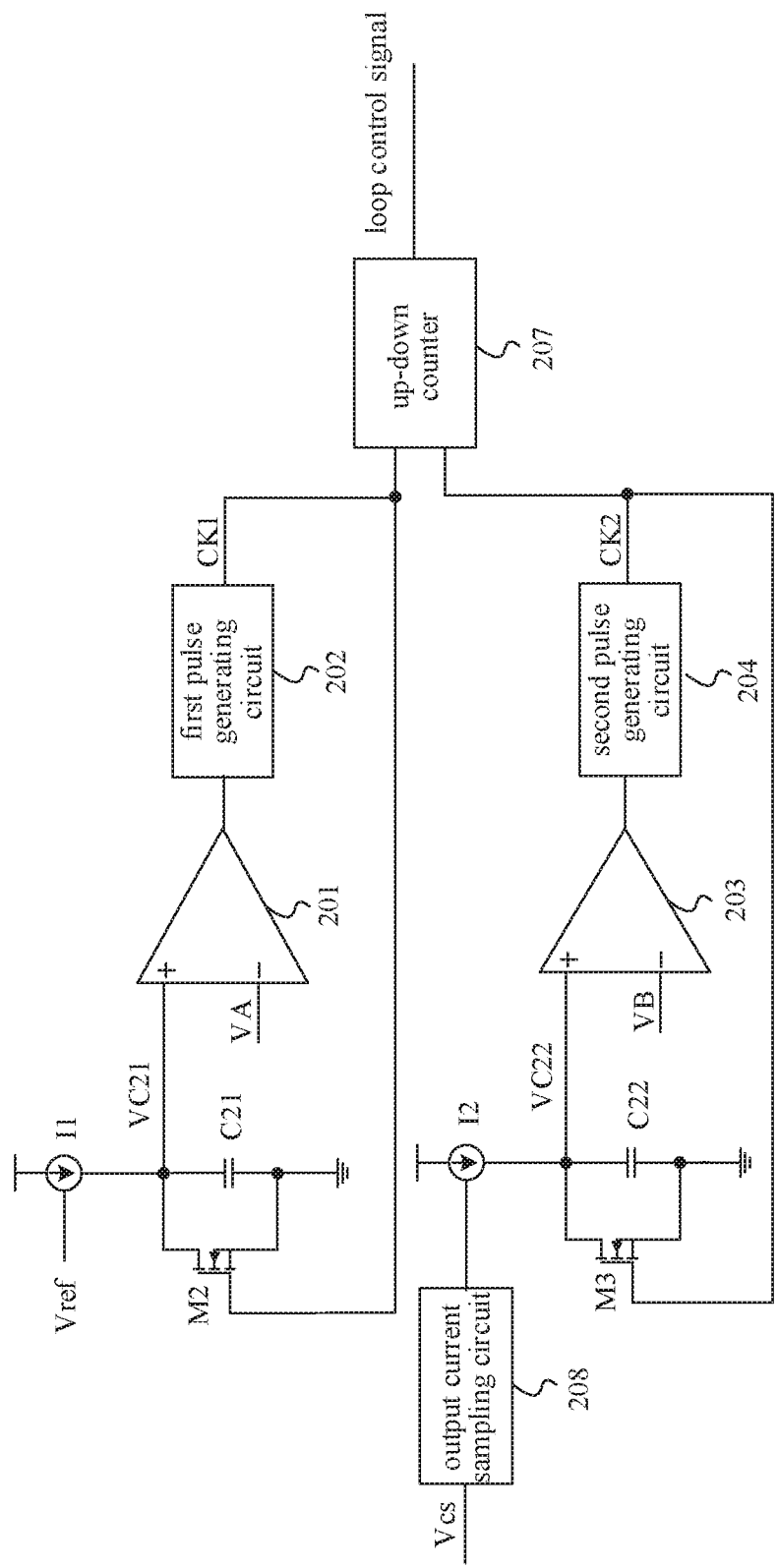
FIG. 7 is a schematic circuit diagram of an example error amplification apparatus according to a fourth embodiment of the present disclosure.

FIG. 7 is a schematic circuit diagram of an example error amplification apparatus according to a fourth embodiment of the present disclosure. The error amplification apparatus includes a first timing-current generating circuit I1, a first capacitor C21, a first switch M2, a first comparator 201, a first pulse generating circuit 202, a second timing-current generating circuit 12, a second capacitor C22, a second switch M3, a second comparator 203, a second pulse generating circuit 204 and an up-down counter 207. The counter value of the up-down counter 207 reflects the compensation voltage, and the counter value is used as a loop control signal. The loop control signal may be directly used to control a PWM signal or the loop control signal may be converted into an analog signal to control the PWM signal. That is, the digital signal outputted from the up-down counter 207 is directly used to control the circuit loop.

Specifically, as shown in FIG. 7, the reference voltage Vref controls the first timing-current generating circuit I1. The first comparator 201 has a positive input terminal coupled to the first timing-current generating circuit I1, one terminal of the first capacitor C21, and a source terminal of the first switch M2; a negative input terminal configured to receive a first reference voltage VA; and an output terminal coupled to an input terminal of the first pulse generating circuit 202. An output terminal of the first pulse generating circuit 202 and a gate terminal of the first switch M2 are coupled to an input terminal of the up-down counter 207. The other terminal of the first capacitor C21 and a drain terminal of the first switch M2 are grounded. The output current sampling circuit 208 samples a voltage Vcs across a sampling resistor Rs to calculate an output current sampling signal to control the second timing-current generating circuit 12. The second comparator 203 has a positive input terminal coupled to the second timing-current generating circuit 12, one terminal of the second capacitor C22 and a source terminal of the second switch M3; a negative input terminal of the second comparator 203 configured to receive a second reference voltage VB; and an output terminal of the second comparator 203 coupled to an input terminal of the second pulse generating circuit 204. An output terminal of the second pulse generating circuit 204 and a gate terminal of the second switch M3 are coupled to an input terminal of the up-down counter 207. The other terminal of the second capacitor C22 and a drain terminal of the second switch M3 are grounded. The loop control signal outputted from the output terminal of the up-down counter 207 is used for controlling the circuit loop.

Figure 8:
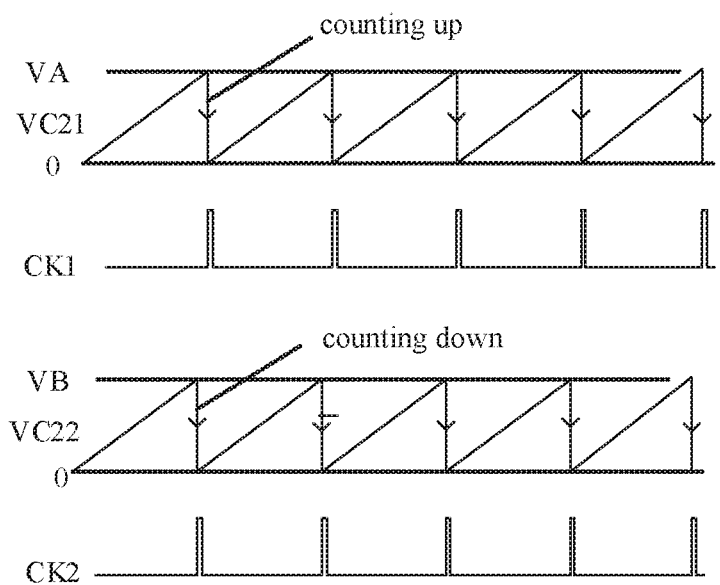
FIG. 8 is a schematic diagram showing the relationship between a narrow pulse signal and the voltage across the compensation capacitor as described in FIG. 7.

As referring to FIG. 7 and FIG. 8, the reference voltage Vref controls the first timing-current generating circuit I1 to charge the first capacitor C21. When the charging voltage reaches the first reference VA, the first comparator 201 reverses and a first pulse CK1 is generated by the first pulse generating circuit 202 for turning on the first switch M2 to clear the voltage across the first capacitor C21, and then a next process for charging and pulse generation continues. Thus, the number of the first pulse CK1 represents the times for which the first capacitor C21 has been charged to the first reference voltage VA by the first timing-current generating circuit I1. Likewise, the output current sampling signal controls the second timing-current generating circuit 12 to charge the second capacitor C22. When the charging voltage reaches the second reference VB, the second comparator 203 reverses and a second pulse CK2 is generated by the second pulse generating circuit 204 for turning on the second switch M3 to clear the voltage across the second capacitor C22, and then a next process for charging capacitor and pulse generation continues. Thus, the number of the second pulse CK2 represents the times for which the second capacitor C22 has been charged to the second reference voltage VB by the second timing-current generating circuit 12.

The up-down counter 207 is capable of counting up and down. In a first condition, counting up is performed for the first pulse CK1 and counting down is performed for the second pulse CK2. In a second condition, counting up is performed for the second pulse CK2 and counting down is performed for the first pulse CK1. As a non-limiting example, the up-down counter 207 is on the basis of a trigger.

Figure 9:
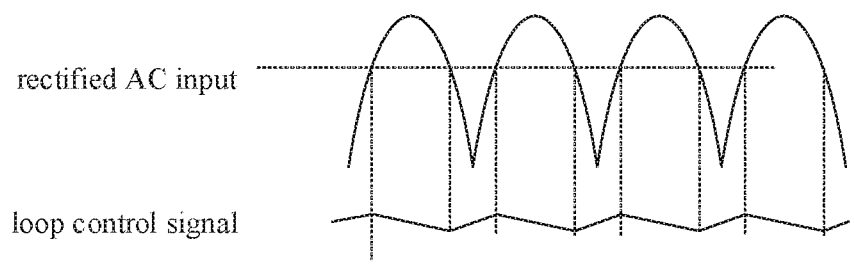
FIG. 9 is a schematic diagram showing relationship between a loop control signal and a rectified alternating current input.

As referring to FIG. 9, the relationship between the loop control signal and a rectified AC input is as follows: in a one half of a half cycle of AC, counting up is achieved as a whole, and the counter value of the up-down counter 207 increases, in the other half of the half cycle of AC, counting down is achieved as a whole and the counter value of the up-down counter 207 decreases. The variation of the output loop control signal of the up-down counter 207 is controlled to be small by setting the number of counting bits of the up-down counter 207, in order to filter out the ripple of AC. In a half cycle of AC, the circuit loop reaches a stable state when the up-count is equal to the down-count.

Specifically, in a half cycle of AC, the variation in the counter value may be large. For example, if each of the counting up and counting down is performed for 100 times, the control signal for changing the counter value for 100 times is required to be substantially unchanged for the purpose of filtering out the ripple of AC. The conventional up-down counter 207 is a 10-bit binary counter, i.e., a required maximum range of variation of the control signal corresponds to counting for 1024 times. In this case, counting for 100 times causes a large variation of the control signal such that filtering out of the AC ripple cannot be achieved. By increasing the number of counting bits of the counter, such as by a factor of 5, the total number of counting bits becomes 15, so that the required maximum range of variation of the control signal corresponds to counting for 32,768 times. If the highest counting bit 10 still corresponds to the required maximum range of variation of the control signal, counting for 100 times causes little variation of the control signal, and thus the ripple of AC is filtered out. In this way, in the AC cycle of 50 Hz or 60 Hz, the variation of the loop control signal corresponding to the up-down counter may be controlled to be small by setting the number of counting bits of the up-down counter, so as to filter out the AC ripple of 50 Hz or 60 Hz. Of course, the number of counting bits of the up-down counter is not limited thereto according to the present disclosure, and an up-down counter having a different number of counting bits is also appropriate as long as the purpose of filtering out the AC ripple can be achieved.

After the circuit loop is stable, the following relationship is satisfied in a half cycle of AC, $$I1 \times C22 \times VB = I2\text{avg} \times C21 \times VA,$$

wherein I1 is a current value generated by the first timing-current generating circuit, C22 is a capacitance value of the second capacitor, VB is a voltage value of the second reference voltage, I2avg is an average of a current value generated by the second timing-current generating circuit, C21 is a capacitance value of the first capacitor and VA is a voltage value of the first reference voltage. I2avg reflects an output current value. According to this equation, the average of the current value generated by the second timing-current generating circuit 12, i.e. the output current value, may be determined, as long as the current value generated by the first timing-current generating circuit I1, the capacitance value of the second capacitor C22, the voltage value of the second reference voltage VB, the capacitance value of the first capacitor C21 and the voltage value of the first reference voltage VA are set. The up-down counter 207 provides an output signal equivalent to the compensation voltage Vcomp of the circuit shown in FIG. 1.

The digital signal from the up-down counter 207 may be directly used to control a PWM signal to adjust the duty cycle of the PWM signal, such that an output current is stabilized by a negative feedback of the circuit loop. It is also possible to convert the digital signal outputted from the up-down counter 207 into an analog signal and then use the analog signal to control the PWM signal to adjust the duty cycle of the PWM signal, such that the output current is stabilized by a negative feedback of the circuit loop.

A Fifth Embodiment

There are problems of circuit matching because the first capacitor C21 and second capacitor C22 are used in FIG. 7. Therefore, in the embodiment, the first capacitor C21 and second capacitor C22 are replaced by one capacitor C31. Moreover, the first timing-current generating circuit I1 and the second timing-current generating circuit I2 are replaced by an error amplifier 401, which is generally a transconductance error amplifier.

Figure 10:
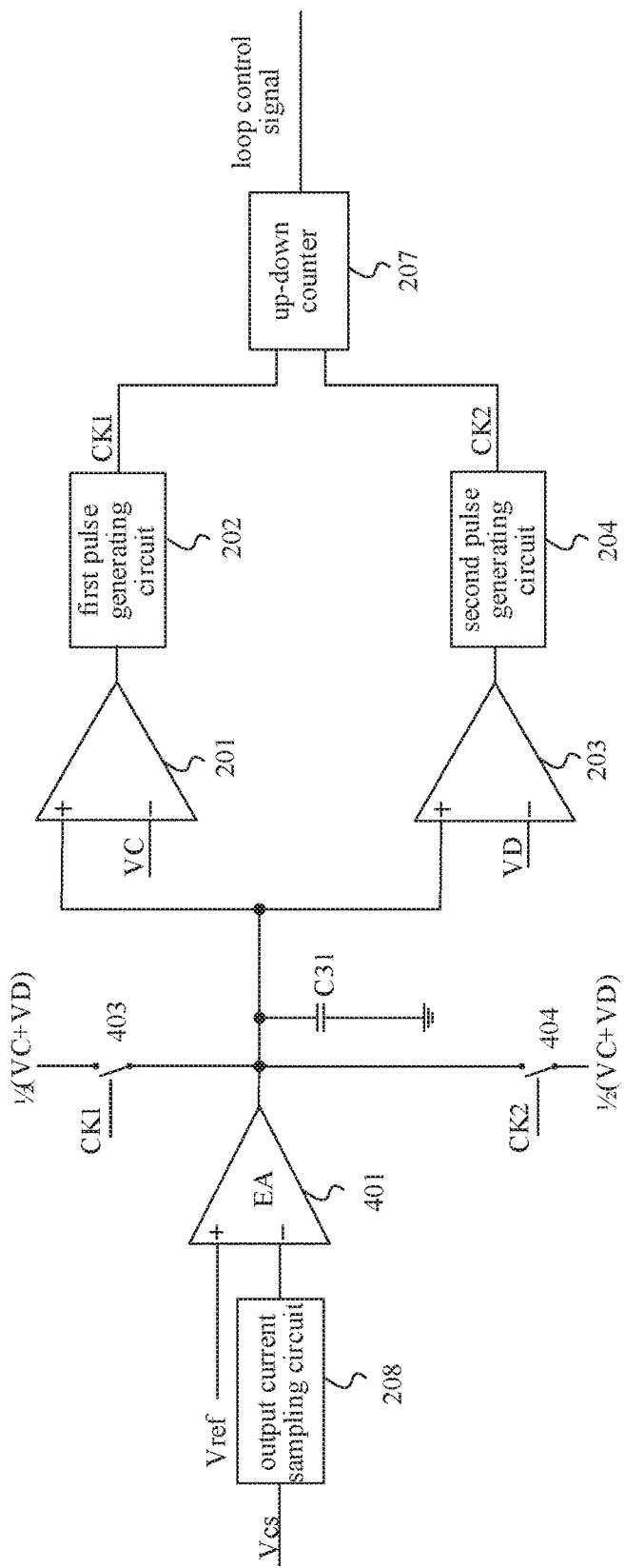
FIG. 10 is a schematic circuit diagram of an example error amplification apparatus according to a fifth embodiment of the present disclosure.

FIG. 10 is a schematic circuit diagram of an example error amplification apparatus according to a fifth embodiment of the present disclosure. As shown in FIG. 10, the error amplification unit includes an error amplifier 401, a capacitor C31, a first switch 403, a first comparator 201, a second switch 404 and a second comparator 203.

The error amplifier 401 two input terminals respectively configured to receive a reference voltage Vref and an output current sampling signal, and an output terminal being coupled to a positive input terminal of the first comparator 201 and a positive input terminal of the second comparator 203. A negative input terminal of the first comparator 201 is configured to receive a third reference voltage VC and an output terminal of the first comparator 201 is coupled to an input terminal of a first pulse generating circuit 202. An output terminal of the first pulse generating circuit 202 is coupled to one input terminal of an up-down counter 207. The first pulse generating circuit 202 provides a first pulse for turning on and off the first switch 403. A negative input terminal of the second comparator 203 is configured to receive a fourth reference voltage VD and an output terminal of the second comparator 203 is coupled to an input terminal of the second pulse generating circuit 204. An output terminal of the second pulse generating circuit 204 is coupled to the other input terminal of the up-down counter 207. The second pulse generating circuit 204 provides a second pulse for turning on and off the second switch 404. The capacitor C31 has one terminal being coupled to an output terminal of the error amplifier 401 and the other terminal being grounded.

The capacitor C31 is charged when an input voltage of the positive input terminal of the error amplifier 401 is larger than an input voltage of the negative input terminal of the error amplifier 401. When the charging voltage is larger than the third voltage VC, a first pulse CK1 is generated for turning on the first switch 403 and the potential of the capacitor C31 is pulled to ½*(VC+VD). The capacitor C31 is discharged when the input voltage of the positive input terminal of the error amplifier 401 is smaller than the input voltage of the negative input terminal of the error amplifier 401. When the discharging voltage is smaller than the fourth reference voltage VD, a second pulse CK2 is generated for turning on the second switch 404 and the potential of the capacitor C31 is pulled to ½*(VC+VD). The first switch 403 and second switch 404 can be implemented by one switch.

The voltage difference for charging the capacitor C31, which corresponds to the first pulse CK1, is equal to ½*(VC−VD), and the voltage difference for discharging the capacitor C31, which corresponds to the second pulse CK2, is equal to ½*(VC−VD). That is, the voltage difference for charging the capacitor C31 is equal to the voltage difference for discharging the capacitor C31. In a half cycle of AC, the counter value of the first pulse CK1 being equal to the counter value of the second pulse CK2 indicates that the charging amount of the capacitor C31 is equal to the discharging amount of the capacitor C31. Thus, the positive and negative input terminals of the error amplifier have the same input voltage, i.e. the function of the error amplifier is accomplished.

A Sixth Embodiment

Figure 11:
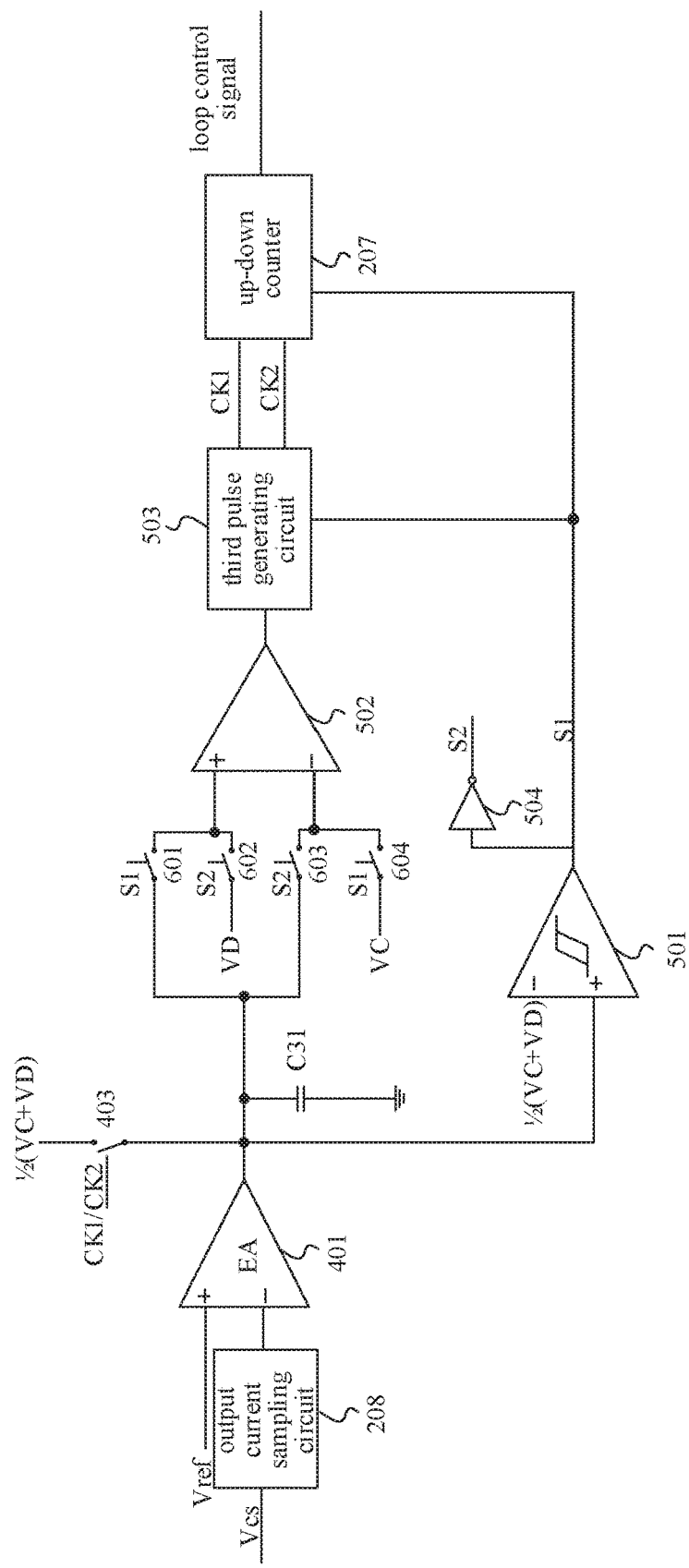
FIG. 11 is a schematic circuit diagram of an example error amplification apparatus according to a sixth embodiment of the present disclosure.

FIG. 11 is a schematic circuit diagram of an example error amplification apparatus according to the sixth embodiment of the present disclosure. As shown in FIG. 11, in this embodiment, the first pulse generating circuit and second pulse generating circuit of FIG. 10 are combined into a third pulse generating circuit 503. The second comparator 502 has an input terminal being coupled to the capacitor C31, VC and VD through selective switches. The first comparator 501 receives a first switching selection signal S1 and a second switching selection signal S2. The first switching selection signal S1 controls the third pulse generating circuit 503. The third pulse generating circuit 503 generates a pulse signal. The first switching selection signal S1 controls the counting direction in order to obtain a first pulse CK1 and a second pulse CK2 from a pulse signal outputted from the third pulse generating circuit 503, i.e. the counting direction of the up-down counter is determined by the first switching selection signal S1 in order to obtain the first pulse CK1 and the second pulse CK2.

Specifically, the error amplification unit includes an error amplifier 401, a capacitor C31, a switch 403, a first comparator 501, a second comparator 502, selective switches 601, 602, 603, 604 and an inverter 504. The error amplifier 401 has two input terminals respectively configured to receive a reference voltage Vref and an output current sampling signal. The first comparator 501 has a positive input terminal configured to receive a fifth reference voltage ½*(VC+VD), a negative input terminal coupled to an output terminal of the error amplifier 401, and an output terminal coupled to an input terminal of the third pulse generating circuit 503 and the inverter 504. The second comparator 502 has a positive input terminal coupled to the capacitor C31 or VD through the selective switches 601 and 602, a negative input terminal coupled to the capacitor C31 or VC through the selective switches 603 and 604, and an output terminal coupled to an input terminal of the third pulse generating circuit 503. An output terminal of the third pulse generating circuit 503 is coupled to an input terminal of the up-down counter 207. The third pulse generating circuit 503 provides a pulse signal for turning on and off the switch 403.

The capacitor C31 is charged when an input voltage of the positive input terminal of the error amplifier 401 is larger than an input voltage of the negative input terminal of the error amplifier 401. When the charging voltage is larger than ½*(VC+VD), the first comparator 501 provides a first switching selection signal S1 for turning on the selective switches 601 and 604, so that the positive input terminal of the comparator 502 is coupled to the capacitor C31 and the negative input terminal of the comparator 502 receives the third reference voltage VC. Meanwhile, the first switching selection signal S1 controls the third pulse generating circuit 503. When the charging voltage is larger than the third reference voltage VC, a first pulse CK1 is generated for turning on the switch 403 and the potential of the capacitor C31 is pulled to ½*(VC+VD).

The capacitor C31 is discharged when an input voltage of the positive input terminal of the error amplifier 401 is smaller than an input voltage of the negative input terminal of the error amplifier 401. When the discharging voltage is smaller than ½*(VC+VD), the first comparator 501 provides a second switching selection signal S2 for turning off the selective switches 602 and 603, so that the positive input terminal of the comparator 502 receives the fourth reference voltage VD and the negative input terminal of the comparator 502 is coupled to the capacitor C31. When the discharging voltage is smaller than VD, a second pulse signal CK2 is generated for turning on the switch 403 and the potential of the capacitor C31 is pulled to ½*(VC+VD).

The voltage difference for charging the capacitor C31, which corresponds to the first pulse CK1, is equal to ½*(VC−VD), and the voltage difference for discharging the capacitor C31, which corresponds to the second pulse CK2, is equal to ½*(VC−VD). That is, the voltage difference for charging the capacitor C31 is equal to the voltage difference for discharging the capacitor C31. In a half cycle of AC, the counter value of the first pulse CK1 being equal to the counter value of the second pulse CK2 indicates that the charging amount of the capacitor C31 is equal to the discharging amount of the capacitor C31. Thus, the positive and negative input terminals of the error amplifier have the same input voltage, i.e. the function of the error amplifier is accomplished. The first pulse CK1 and second pulse CK2 have same function as in FIG. 7 and FIG. 9, and related description is omitted herein for simplicity As seen from the generation process of the first pulse CK1 and the second pulse CK2, the first pulse CK1 and the second pulse CK2 may be combined into a signal (i.e. the first pulse CK1 and the second pulse CK2 may be obtained from one and the same pulse signal outputted from the third pulse generating circuit 503), while the counting direction of the up-down counter is directly determined by the first switching selection signal S1, having the same effect as above.

A Seventh Embodiment

There is provided a driving circuit including an error amplification apparatus 701. The error amplification apparatus 701 may adopt the structure of any of the above described embodiments.

Figure 12:
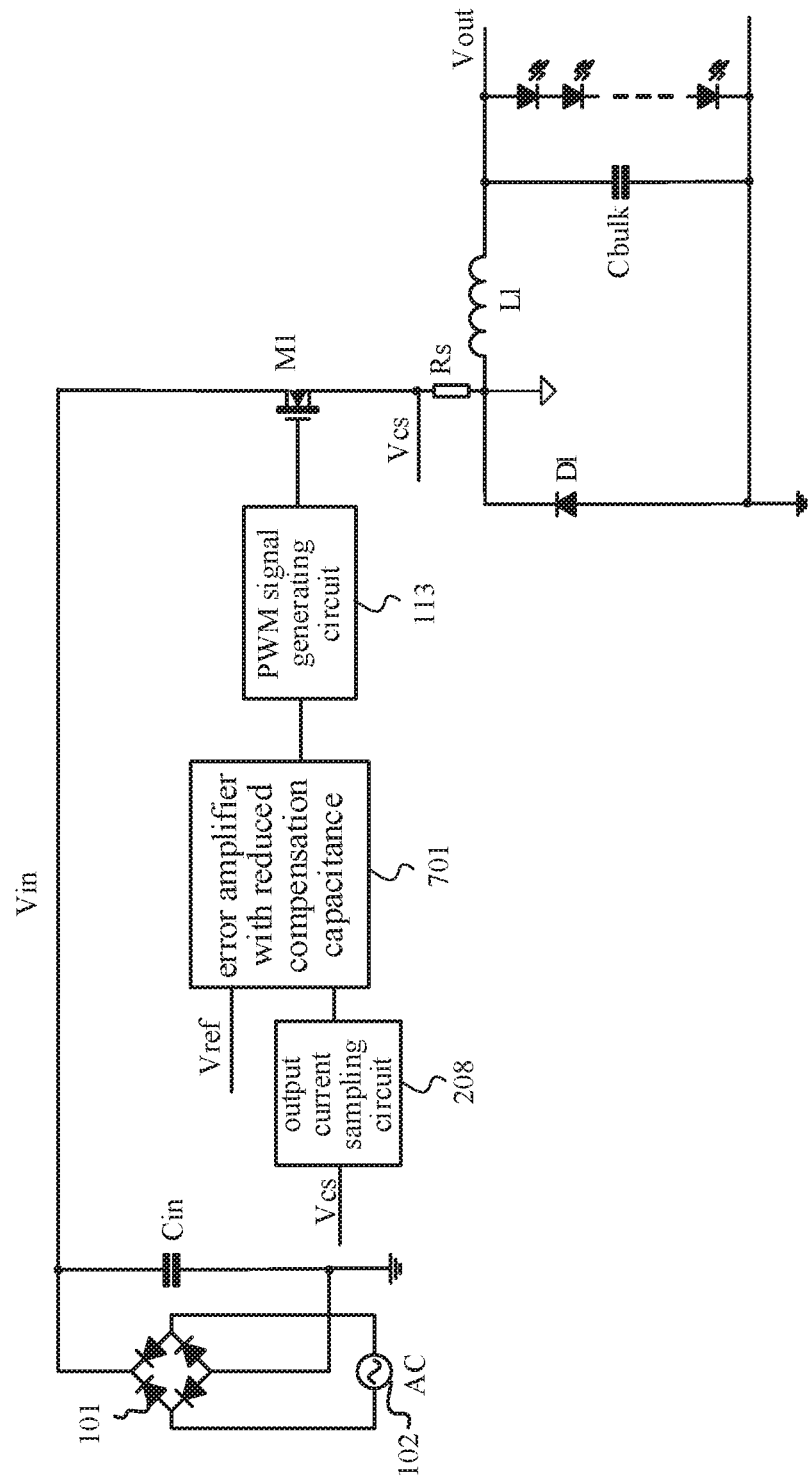
FIG. 12 is a schematic circuit diagram of an example driving circuit according to a seventh embodiment of the present disclosure.

As shown in FIG. 12, the driving circuit mainly includes an AC input rectifier circuit 101, an AC input source 102, an input capacitor Cin, an inductor L1, a power switch M1, a sampling resistor Rs, a freewheeling diode D1, an output capacitor Cbulk, an output current sampling circuit 208, an error amplification apparatus 701 and a PWM signal generating circuit 113.

The AC input rectifier circuit 101 receives an AC input voltage from the AC input source 102 and rectifies the voltage. The input capacitor Cin has one terminal being coupled to an voltage input terminal Vin and the other terminal being grounded. The power switch M1 has a source terminal being coupled to the voltage input terminal Vin, a drain terminal being coupled to one terminal of the sampling resistor Rs and a gate terminal at which a driving signal from the PWM signal generating circuit 113 is received. The inductor L1 has one terminal being coupled to the other terminal of the sampling resistor Rs and the other terminal being coupled to one terminal of the output capacitor Cbulk. The freewheeling diode D1 has a cathode being coupled to one terminal of the sampling resistor Rs and an anode being coupled to the other terminal of the output capacitor Cbulk. The output capacitor Cbulk is coupled in parallel with a load, such as an LED load. The sampling resistor Rs samples an output current for driving the power switch M1. The error amplification apparatus 701 has an input terminal being coupled to the output current sampling circuit 208 and an output terminal being coupled to the PWM signal generating circuit 113. The loop control signal output by the counting unit controls the PWM signal, and thus controls the circuit loop which is the loop of the driving circuit.

It should be pointed out that the disclosure may be applied in any of a closed-loop constant-current control circuit, a closed-loop constant-voltage control circuit and a closed-loop constant-power control circuit for reducing the capacitance of the compensation capacitor so that the compensation capacitor may be arranged within a chip, simplifying the peripheral circuit and improving the circuit reliability.

The error amplification apparatus according to the present disclosure may be used in variety of power supply topologies, including but not limited to a buck topology, boost topology, inverter topology, buck-boost topology and so on. In practical, it is possible to directly replace the original error amplifier in the circuit by the error amplification apparatus according to the present disclosure, related description is omitted for simplicity.

Various embodiments of the present disclosure have been described herein in a progressive way, in which the differences between different embodiments are emphasized and the same or similar parts may be read in the context of relevant embodiments. Because the system embodiments basically correspond to the method embodiments, the description of system embodiments is simple, and reference can be made to the description of the method embodiments for relevant parts.

The above description is only intended to give preferred embodiments of the disclosure, not to make any limitation to the disclosure. Any change and modification made by one skilled in the art on basis of the above description fall within the scope of the claims.

What is claimed is:

1. An error amplification apparatus, comprising: an error amplification unit; a pulse generating circuit being coupled to said error amplification unit and configured to generate a first pulse and a second pulse in accordance with an output voltage of said error amplification unit; a counting unit being coupled to said pulse generating circuit and configured to count said first pulse and said second pulse and generate a loop control signal representing a compensation voltage based on said count.

2. The error amplification apparatus according to claim 1, wherein said counting unit comprises:
   a counter being coupled to said pulse generating circuit and configured to count said first pulse and said second pulse; and
   a counter signal sample and hold circuit being coupled to said counter and receiving a sampling signal with a constant time interval which is synchronized with a rectified alternating current input and which controls said counter signal sample and hold circuit to sample a counter value from said counter at a constant time interval.

3. The error amplification apparatus according to claim 1, wherein said counting unit comprises:
an up-down counter having a predetermined number of counting bits and being coupled to said pulse generating circuit, said up-down counter is configured to count up or down said first pulse and said second pulse to output said loop control signal, which is directly used to control a PWM signal or which is converted to an analog signal to control a PWM signal in order to filter out a ripple of alternating current.

4. The error amplification apparatus according to claim 3, wherein said up-down counter is configured to provide a counter value which increases during a first part of a half cycle of alternating current and decreases during a second part of said half cycle of alternating current, the increased counter value is equal to the decreased counter value in said half cycle of alternating current.

5. The error amplification apparatus according to claim 1, wherein said pulse generating circuit comprises a first pulse generating circuit for generating said first pulse and a second pulse generating circuit for generating said second pulse.

6. The error amplification apparatus according to claim 5, wherein said error amplification unit comprises a first timing-current generating circuit, a first capacitor, a first switch, a first comparator, a second timing-current generating circuit, a second capacitor, a second switch and a second comparator;
said first comparator has a positive input terminal being coupled to said first timing-current generating circuit, one terminal of said first capacitor and a source terminal of said first switch, a negative input terminal for receiving a first reference voltage and an output terminal being coupled to an input terminal of said first pulse generating circuit;
said first pulse generating circuit has an output terminal being coupled to an input terminal of said counting unit, said first switch has a gate terminal being coupled to said input terminal of said counting unit and a drain terminal being grounded, the other terminal of said first capacitor is grounded;
said second comparator has a positive input terminal being coupled to said second timing-current generating circuit, one terminal of said second capacitor and a source terminal of said second switch, said second comparator has a negative input terminal for receiving a second reference voltage and an output terminal is coupled to an input terminal of said second pulse generating circuit;
said second pulse generating circuit has an output terminal being coupled to another input terminal of said counting unit, said second switch has a gate terminal being coupled to said another input terminal of said counting unit and a drain terminal being grounded, the other terminal of said second capacitor is grounded.

7. The error amplification apparatus according to claim 6, wherein said first timing-current generating circuit charges said first capacitor under control of a reference voltage, said first comparator reverses and said first pulse generating circuit generates said first pulse to control said first switch to be turned on for clearing an voltage across said first capacitor when a charging voltage reaches said first reference voltage, and a next process of charging and pulse generation process continues; said second timing-current generating circuit charges said second capacitor under control of an output current sampling signal, said second comparator reverses and said second pulse generating circuit generates a second pulse for controlling said second switch to be turned on for clearing a voltage across said second capacitor when a charging voltage reaches said second reference voltage, and a next process of charging and pulse generation process continues.

8. The error amplification apparatus according to claim 7, wherein a following relationship is satisfied in a half cycle of alternating current, $$I1 \times C22 \times VB = I2avg \times C21 \times VA$$

wherein I1 is a current value generated by said first timing-current generating circuit, C22 is a capacitance value of said second capacitor, VB is a voltage value of said second reference voltage, I2avg is an average of a current value generated by said second timing-current generating circuit, C21 is a capacitance value of said first capacitor and VA is a voltage value of said first reference voltage.

9. The error amplification apparatus according to claim 7, wherein an average of a current value generated by said second timing-current generating circuit is determined by a current value generated by said first timing-current generating circuit, a capacitance value of said second capacitor, a voltage value of said second reference voltage, a capacitance value of said first capacitor and a voltage value of said first reference voltage.

10. The error amplification apparatus according to claim 5, wherein said error amplification unit comprises an error amplifier, a capacitor, a first switch, a first comparator, a second switch and a second comparator;
said error amplifier has a positive input terminal for receiving a reference voltage, a negative input terminal for receiving an output current sampling signal, and an output terminal being coupled to a positive input terminal of said first comparator and a positive input terminal of said second comparator;
said first comparator has a negative input terminal for receiving a third reference voltage and an output terminal being coupled to an input terminal of said first pulse generating circuit;
said first pulse generating circuit has an output terminal being coupled to one input terminal of said counting unit and provides said first pulse to control said first switch to be turned on and off;
said second comparator has a negative input terminal for receiving a fourth reference voltage and an output terminal being coupled to an input terminal of said second pulse generating circuit;
said second pulse generating circuit has an output terminal being coupled to the other input terminal of said counting unit and provides said second pulse to control said second switch to be turned on and off; and
said capacitor has one terminal being coupled an output terminal of said error amplifier and the other terminal being grounded.

11. The error amplification apparatus according to claim 10, wherein said capacitor is charged when an input voltage of said positive input terminal of said error amplifier is larger than an input voltage of said negative input terminal of said error amplifier, a first pulse is generated to turn on said first switch and a potential of said capacitor is pulled to ½*(said third reference voltage+said fourth reference voltage) when a charging voltage is larger than said third reference voltage; said capacitor is discharged when an input voltage of said positive input terminal of said error amplifier is smaller than an input voltage of said negative input terminal of said error amplifier, a second pulse is generated to turn on said second switch and a potential of said capacitor is pulled to ½*(said third reference voltage+said fourth reference voltage) when a discharging voltage is smaller than said fourth reference voltage.

12. The error amplification apparatus according to claim 11, wherein a voltage difference for charging said capacitor, which corresponds to said first pulse, is ½*(said third reference voltage−said fourth reference voltage), a voltage difference for discharging said capacitor, which corresponds to said second pulse, is ½*(said third reference voltage−said fourth reference voltage), and in a half cycle of alternating current, a counter value of said first pulse being identical to a counter value of said second pulse indicates that a charging amount of said capacitor is equal to a discharging amount of said capacitor.

13. The error amplification apparatus according to claim 10, wherein said error amplifier is a transconductance error amplifier.

14. The error amplification apparatus according to claim 1, wherein said pulse generating circuit comprises a third pulse generating circuit for generating a pulse signal to obtain said first pulse and said second pulse.

15. The error amplification apparatus according to claim 14, wherein said error amplification unit comprises an error amplifier, a capacitor, a first switch, a first comparator, a second comparator, four selective switches and an inverter;
said error amplifier has a positive input terminal for receiving a reference voltage and a negative input terminal for receiving an output current sampling signal;
said first comparator has a positive input terminal for receiving a fifth reference voltage, a negative input terminal being coupled to an output terminal of said error amplifier and an output terminal being coupled to an input terminal of said third pulse generating circuit and said inverter, said fifth reference voltage is ½*(said third reference voltage+said fourth reference voltage);
said second comparator has a positive input terminal being coupled to said capacitor and said third reference voltage or said fourth reference voltage by said four selective switches, said second comparator has an output terminal being coupled to an input terminal of said third pulse generating circuit;
said third pulse generating circuit has an output terminal being coupled to an input terminal of said counting unit and provides a pulse signal for controlling said first switch to be turned on and off.

16. The error amplification apparatus according to claim 15,
wherein said capacitor is charged when an input voltage of said positive input terminal of said error amplifier is larger than an input voltage of said negative input terminal of said error amplifier, and when a charging voltage is larger than ½*(the said third reference voltage+the said fourth reference voltage), said first comparator provides a first switching selection signal and a positive input terminal of said first comparator is coupled to said capacitor and a negative input terminal of said first comparator receives said third reference voltage and said first switching selection signal controls said third pulse generating circuit such that when a charging voltage is larger than said third reference voltage, a first pulse is generated for turning on said first switch and a potential of said capacitor is pulled to ½*(said third reference voltage+said fourth reference voltage); said capacitor is discharged when an input voltage of said positive input terminal of said error amplifier is smaller than an input voltage of said negative input terminal of said error amplifier; and when a discharging voltage is smaller than ½*(said third reference voltage+said fourth reference voltage), said first comparator provides a second switching selection signal and a positive input terminal of said second comparator is coupled to said fourth reference voltage and a negative input terminal of said second comparator is coupled to said capacitor; a second pulse is generated to turn on said first switch and a potential of said capacitor is pulled to ½*(said third reference voltage+said fourth reference voltage) when a discharging voltage is smaller than said fourth reference voltage.

17. The error amplification apparatus according to 16, wherein a voltage difference for charging said capacitor, which corresponds to said first pulse, is ½*(said third reference voltage−said fourth reference voltage), a voltage difference for discharging said capacitor, which corresponds to said second pulse, is ½*(said third reference voltage−said fourth reference voltage), and in a half cycle of alternating current, a counter value of said first pulse being identical to a counter value of said second pulses indicates that a charging amount of said capacitor is equal to a discharging amount of said capacitor.

18. The error amplification apparatus according to claim 2, wherein said counter is an up-down counter.

19. The error amplification apparatus according to claim 18, wherein said counter is configured to count up for said first pulse and count down for said second pulse, or said counter is configured to count up for said second pulse and count down for said first pulse.

20. The error amplification apparatus according to claim 19, wherein in a half cycle of alternating current, said counter value of said counter and said digital signal stored in said counter signal sample and hold circuit will increase if an incremental value of said counter is larger than a decremental value of said counter, and in a half cycle of alternating current, said counter value of said counter and a digital signal stored in said counter signal sample and hold circuit will decrease if an incremental value of said counter is smaller than a decremental value of said counter, and in a half cycle of alternating current, said counter value of said counter and a digital signal stored in said counter signal sample and hold circuit will be unchanged if an incremental value of said counter is equal to a decremental value of said counter.

21. The error amplification apparatus according to claim 2, wherein said counter is on the basis of a trigger.

22. The error amplification apparatus according to claim 2, wherein said counter signal sample and hold circuit is on the basis of a trigger.

23. The error amplification apparatus according to claim 2, wherein said sampling signal with a constant time interval is obtained from a voltage and current waveform relevant to the alternating current input.

24. The error amplification apparatus according to claim 2, wherein said counter signals sample and hold circuit provides a digital signal which is directly used to control a PWM signal or which is converted to an analog signal to control a PWM signal.

25. The error amplification apparatus according to claim 3, wherein said up-down counter is on the basis of a trigger.

26. The error amplification apparatus according to claim 3, wherein said up-down counter is a decimal up-down counter.

27. The error amplification apparatus according to claim 3, wherein said up-down counter is a 10-bit or 15-bit up-down counter.

28. The error amplification apparatus according to claim 1, wherein said error amplification apparatus is used in a closed-loop constant-current control circuit, a closed-loop constant-voltage control circuit or a closed-loop constant-power control circuit.

29. The error amplification apparatus according to claim 1, wherein said error amplification apparatus is used in a buck topology, a boost topology, a fly-back topology or a buck-boost topology.

30. A driving circuit comprising the error amplification apparatus according of claim 1.

31. The driving circuit according to claim 30, further comprising an output current sampling circuit being coupled to an input terminal of said error amplifier and a PWM signal generating circuit being coupled to an output terminal of said error amplifier.

* * * * *